Dec. 28, 1965 J. C. HAENICHEN 3,226,612

SEMICONDUCTOR DEVICE AND METHOD

Filed March 18, 1963

Inventor
John C. Haenichen
BY
Attys.

3,226,612

SEMICONDUCTOR DEVICE AND METHOD

John C. Haenichen, Scottsdale, Ariz., assignor to Motorola, Inc., Franklin Park, Ill., a corporation of Illinois Filed Mar. 18, 1963, Ser. No. 265,736
9 Claims. (Cl. 317—234)

This application is a continuation-in-part of copending application Serial No. 218,904 filed August 23, 1962.

This invention relates to stabilized or passivated semiconductor devices and more particularly to a method of fabricating stabilized rectifying and zener diodes, and transistors suitable for high voltage operation.

The necessity for making semiconductor devices stable and reliable is readily apparent when one considers the importance of their use in civil an military electronics where in some applications hundreds or thousands of such devices are employed together in a dependent manner. Semiconductor devices that have been stabilized in certain ways are sometimes referred to as passivated.

Among the most stable and reliable semiconductor devices are those having diffused and passivated junctions, including the type known as planar passivated devices. To date, certain of the planar passivated devices, NP diodes and PNP transistors have had a serious limitation in that they have not been suitable for use at high voltages. Other planar devices which are suitable for high voltage use such as PN diodes and NPN transistors are well-known but are expensive to manufacture since production losses are often rather large. There is a ready commercial market for high voltage planar passivated devices and, therefore, considerable research and development effort has gone into the solution of problems of their design and manufacture.

Low voltage silicon NP diodes and PNP transistors of the planar passivated type are not difficult to make but there is a basic physical phenomenon known as "channeling" which tends to limit the voltage at which a typical planar transistor may be designed to operate. Channeling, which in this case in the formation of a false N region, is believed to be caused by a number of related processing and structural factors which are otherwise desirable but cause these planar passivated devices of an intended high voltage design to act like an entirely different and unsuitable device.

Planar passivated NP diodes and PNP transistors are stable and reliable largely because a protective film of silicon dioxide or glass covers portions of the junctions that might normally change or degrade if exposed. It happens that when the proper semiconductor requirements for high voltage operation are met in the P regions of these devices, the protective glass or silicon dioxide film causes this material to act as if it were N type nearest the film. This false N region connects to the true N region and provides a path through which current can flow in a unique way which will be discussed later. The false N region is called an N type induced channel and causes such a serious change in some of the device characteristics that only the low voltage type of these planar passivated devices have been feasible in the past.

A really superior NP diode or PNP transistor would be one having the desirable characteristics of the planar passivated structures but operable at high voltages as well, and as will become apparent, such devices may be made by suitably shaping and controlling of induced channels.

In PN planar passivated diodes and in NPN planar passivated transistors, a less serious but similar problem exists but the mechanism involved is not fully understood at the present time. The mechanism, however, is such that the action of it on the devices is explainable to a certain extent by assuming a P type induced channel nearest the protective glass or silicon dioxide film which provides an electrical path leading from the true P regions of the diodes or transistors. Whatever the mechanism, the result statistically is devices having reverse or leakage currents which tend to be high so that during manufacture a substantial portion of any given lot of these devices is rejected for this reason.

The existence of P type induced channels in high voltage PN and NPN devices is difficult to verify but it is significant that the above mechanism is controllable by methods which would be expected to shape and control a P type channel. In this specification, P type induced channels will be treated as a cause of high reverse currents in PN and NPN devices with the knowledge that such reverse currents may be due to some entirely different reason.

In accordance with the foregoing discussion, it is an object of this invention to provide a means by which high voltage planar passivated NP diodes and PNP transistors may be made.

Another object of this invention is to provide an improved method of making PN diodes and NPN transistors so that they may be made with a smaller percentage of devices being rejected.

It is another object of this invention to provide a means of constructing channels of a desired shape.

A feature of this invention is the use of well-known selective diffusion techniques to lower the resistivity of P type pi silicon in order to interrupt induced N regions occurring at silicon dioxide-P type silicon interfaces, and glass-P type silicon interfaces and similarlly to lower the resistivity of N type silicon in order to interrupt induced P regions occurring at silicon dioxide-N type silicon, and glass-N type silicon interfaces.

Figures 1, 2, 3, 4, 5, 6:
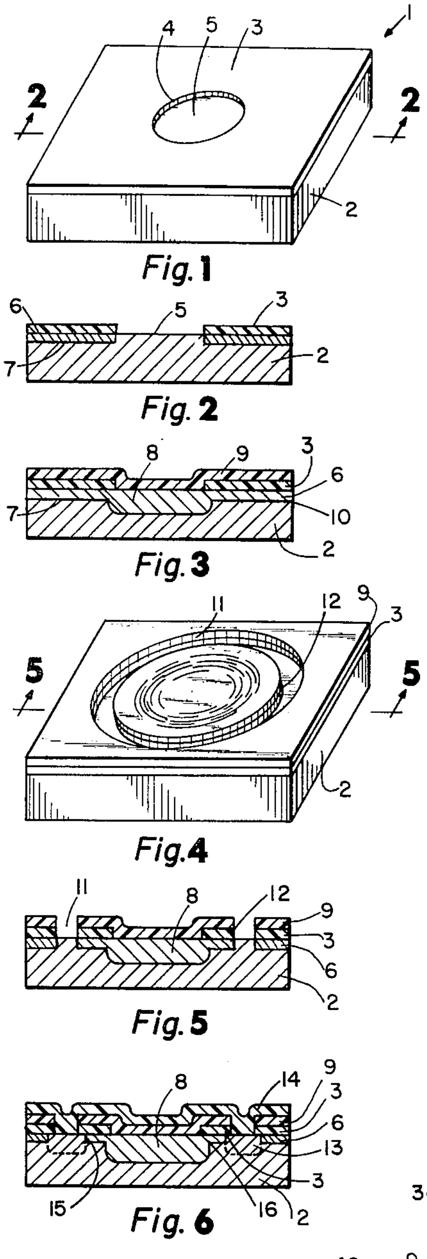
FIG. 1 shows, as an early step in the prepartion of a zener diode, a silicon dioxide coated silicon die after a region of the silicon dioxide has been selectively etched away.
FIG. 2 is a cross section through the die of FIG. 1.
FIG. 3 shows the die following a diffusion step.
FIG. 4 shows the die following prepartion for a subsequent diffusion.
FIG. 5 is a cross sectional view of FIG. 4 taken at line 5—5.
FIG. 6 is a cross section through the die of FIG. 3 following a second diffusion treatment in which the zener diode is make non-channeling.

In accordance with this invention, improved planar passivated junction devices and planar passivated transistors may be made that are suitable for high voltage use.

A category of devices of the planar passivated type suitable for high voltage use might be expected to consist of at least one diffused N region within a region of pi silicon, i.e., high resistivity P type silicon, to form an NP junction having a boundary at the surface of the silicon and covered with a passivating film. Unfortunately, the passivating film frequently induces an N type channel at the interface between the film and the pi silicon, and the channel seriously degrades certain parameters of the device. It has been found that such a channel may be interrupted by selectively diffusing P impurity into the pi silicon lying just outside the periphery of the surface portion of the NP junction, and the degrading effect of the channel can be avoided in this manner.

In the opposite category of high voltage planar passivated devices, those having a PN junction formed by a P diffusion on high resistivity N type material, a P type channel frequently forms which also degrades the devices in a similar manner. This channel may be interrupted by diffusing N impurity into the high resistivity N type silicon outside of the PN junction and the degrading effect of the channel is avoided. Except for the fact that different type impurities are used to interrupt the channels, the method of channel interruption is the same in either category.

The following text and accompanying drawings are to explain more fully the nature of high voltage passivated devices and their method of fabrication according to this invention. Of such devices, only the better understood NP diode and PNP transistor will be considered in detail.

As is well-known, by masking off portions of silicon with diffusion resistant materials, diffusion may be confined to regions at selected areas of the silicon; this is selective diffusion. Some impurity materials diffuse very slowly through silicon dioxide and certain glasses so that it is possible to partially cover or mask regions of a silicon wafer with a film of one or more of these in order to prevent some regions being diffused to any great extent by impurity materials of this kind while allowing diffusion to take place at other regions. When rectifying junctions are formed by selective diffusion, as they are in planar passivated devices, the surface portion of the junction lies beneath a film of silicon dioxide or glass. This is the case because the impurity being diffused at an opening in the film diffused in all directions into material having a lower concentration of this impurity so that the silicon also becomes diffused a slight distance under the film edges bounding the exposed regions; therefore, the junction at the surface of the silicon lies beneath a silicon dioxide or glass film. If the film at the silicon was thermally formed, that is, formed by heating and oxidizing the silicon wafer, the silicon-film interface will be very clean as many contaminants will remains at the outer surface since the film usually forms beneath them. By virtue of this fact, junctions at this interface will be very clean and more free of surface contaminants which may ionize. This is important since, ordinarily, due to the intense electric field across a back biased rectifying junction, surface conduction by ionic or polarizable species of contaminants contributes greatly to junction leakage current.

Planar passivated junctions which are junctions prepared and protected as just described tend to be stable and reliable, not only because of their intrinsic separation from ionizable surface contaminants, but also because the dielectric and insulating qualities of silicon dioxide or the glasses ordinarily covering the junction at the surface cause a reduction in the electric field and in conduction at this region. The silicon dioxide or glass covering the junction is referred to as a passivating film.

As previously mentioned, a major problem common to NP planar passivated junction devices which, of course, includes NP planar passivated diodes and PNP planar passivated transistors, has been that of making these devices suitable for high voltage operation, i.e., making reliable devices with a high breakdown voltage characteristic. To make a high breakdown voltage NP junction, it is desirable that the P material of the NP junction have a fairly high resistivity. High resistivity P type silicon is called pi silicon. The planar passivated diode has a passivating film of silicon dioxide or glass covering the surface portion of the NP junction which normally causes a smaller reverse current. However, when the P material is of high resistivity, the reverse current becomes much greater and the diode has a current versus voltage curve similar to that of a current limiting device.

A current limiter structure based on a well-known physical model, requires that a flat thin region of relatively high resistivity silicon, called a channel, lie adjacent a region of silicon of the opposite conductivity type; one terminal of the device shorts or resistively connects both types of material at one region and the other terminal is connected at a different region to high resistivity material of just one type. The device is so constructed that current carriers flow preferentially through the thin high resistivity material, and when a voltage above a certain critical voltage, called the "pinch off voltage," is applied across the terminals of the device, a depletion region lying both within and outside of the channel closes off the channel and further acts so that a nearly fixed voltage drop exists across the length of it. A particular voltage drop across the channel of a device causes that part of the depletion region within it to assume a given form and this largely determines what the electrical resistance of the channel will be. Therefore, at voltages above the "pinch off voltage," the nearly constant voltage across the channel fixes its resistance and under these conditions the current that can flow through it is limited to some nearly constant value. The device structure is such that the voltage difference between the applied and the pinch off voltage simply causes further thickening of the depletion region in a space outside of the channel and acts as if it were across a simple reverse biased junction so that the small increase in the current occurring due to this particular voltage difference is of the order of junction leakage current. The device will limit current up to a given maximum applied voltage where voltage breakdown occurs.

In the planar passivated NP junction the silicon dioxide or glass in some manner causes the lightly doped or high resistivity P type semiconductor material beneath its surface to act as if it were a high resistivity N type channel, and since this channel usually leads to some high leakage, high recombination or other high conductivity region between the N channel and the pi silicon which is roughly equivalent to the shorted or resistively connected terminal region of the current limiter, this whole structure is then somewhat like that of the previously discussed semiconductor current limiting device. Hence, for this structure, a current versus reverse voltage curve will resemble that of a current limiter rather than that of an ordinary back biased junction. The formation of an apparent or false N region of this kind is called induced channeling. Also, since the channel that is induced extends the N region of the NP junction to all of the adjacent area of pi silicon that is coated with a continuous silicon dioxide or glass film, there may be quite a large capacitive effect associated with the phenomenon. It is interesting to note that when the film is removed, the current versus voltage curve becomes that of an ordinary unpassivated reverse biased junction. In the past, in order to have the inherent reliability and very low reverse currents, it has been both necessary and desirable that the silicon dioxide or glass cover the NP surface region so that planar passivated NP junctions have necessarily been of the low breakdown voltage type since wafers of P type silicon of a low resistivity had to be used to prevent the induced channeling or current limiter effect from occurring.

The mechanism by which N induced channels are formed is not fully known in this case. It is believed that certain positive ions such as hydrogen ions diffuse into and are held by the glass or silicon dioxide film and so give it a positive charge which induces a negative charge at the surface of the pi silicon. Also, operating conditions, storage conditions, but especially changes in the ambient or atmosphere in which the transistor is encapsulated, may for a variety of reasons, including exposure to a radioactive or ionizing environment, affect the surface in a manner such as to form induced channels.

If enough electrons are brought to the surface so that their numbers are greater than the number of available holes, this region will act as it if were N type material since any conduction which occurs will be due in the largest part to the flow of these electrons.

An NP junction having the characteristics of the usual planar passivated junction but with a high breakdown voltage as well, can be made using ordinary device design considerations if induced channeling can be prevented or its effects eliminated or minimized. The fabrication process to be illustrated and described for making high voltage planar passivated NP junction devices uses a means of minimizing the effect of the induced channel and accomplishes this by interrupting the channel with a highly doped P region formed by a solid state diffusion operation.

If one assumes the presence of P type channels on high voltage planar PN diodes and NPN transistors, a current limiter model can be used to explain the high average value of the reverse currents of a large random sample of such devices. For this case, if a P type channel is formed adjacent the passivating film, then conduction through the channel is considered to occur by hole flow rather than electron flow and a high recombination condition at the region where the channel terminates or before it terminates would account for the high average reverse current. In these devices, it should be noted that the P type channel whether induced or real disappears upon removal of the passivating film and does not continue through true N regions of low resistivity. P type channels may vary depending on the manufacturing operating and storage history of the device; exposure to ionizing environments is also a factor, e.g., radioactivity may, depending on the nature of the radiation, either alter the intensity of a channel or remove it.

Considering first the devices having N type induced channels, FIGS. 1 through 6 show various stages of NP zener diode fabrication. FIG. 1 is a rectangular semiconductor element 1 consisting of a die portion 2 cut from a large wafer (not shown) of high resistivity P type silicon called pi silicon upon which a region of silicon dioxide 3 has been thermally grown. A circular region 4 of the silicon dioxide has been removed to expose the underlying silicon and N impurity will be selectively diffused into the silicon at this region 5. The masking action of the silicon dioxide prevents significant amounts of N impurity from diffusing into the covered regions.

FIG. 2, a sectional view of the die taken at 2—2, shows a layer of silicon dioxide 3 at just the upper surface of the silicon, but it should be understood that in practice all regions of the silicon that are not intended to be significantly altered by diffusion may be covered with a silicon dioxide or glass film. In practice, it is common to fabricate many semiconductor units at once on a single wafer Thus, any die shown in the drawings represents part of a larger wafer. However, the description will be simplified by referring to individual die units.

An N type channel region 6 is formed at the silicon dioxide-pi silicon interface and is represented schematically as the region lying between the full line 7 of FIG. 2 and the silicon dioxide 3.

In FIG. 3, the wafer of silicon is shown after having been diffused with phosphorus impurity to form an N region 8. The phosphorus was supplied from a layer of phosphosilicate glass 9 which was formed initially on the silicon in a prediffusion step. A prediffusion step of this type to form an impurity source at the surface of the silicon is sometimes referred to as an impurity predeposition and will be discussed further on. The N type diffused region 8 is electrically in direct contact with the N type channel region 6 so that the NP junction exists across the surface of the wafer and terminates as a surface NP region 10 at the exposed edges where the die was cut from the wafer.

For illustrative purposes, discrete regions of silicon dioxide and glass are shown in the drawings. It should be understood that due to the interaction of the glass and silicon dioxide at prediffusion and diffusion temperatures, the silicon dioxide becomes a glass. The glasses will also interact and change in composition, and the existence of discrete boundaries as illustrated between glasses formed and treated as these are, is questionable.

In order to eliminate the current limiter action of the diode, a ring of the silicon dioxide and phosphosilicate glass is etched from the die surface as shown in FIG. 4. The width of the ring is not critical and so the outermost regions of silicon dioxide may be stripped away to the edge of the die, if desired. The annular ring 11 was etched through the silicon dioxide and glass to expose a region of pi silicon lying a small distance outside of the NP region of the device. This is shown more clearly in FIG. 5. The opening 11 has interrupted the induced channel 6 but this alone is an inadequate treatment since etching has also exposed a continuation of the device junction formed by the N channel and the pi silicon. The periphery of this continuation is at the inner edge 12 of the etched annulus and the device junction does not have the low leakage currents of a passivated junction since the continued junction region terminates at the edge of the silicon dioxide or glass rather than at a boundary lying fully beneath it. However, since the channel has been terminated near the base-collector junction and does not connect to the larger surface of the transistor and the edges of the die, there is appreciably less leakage through the channel so that just opening the oxide as described constitutes an improvement even though the device has not been optimized. For completeness it should be noted that channels may form on stripped surfaces, possibly because it is practically impossible to obtain a useful surface that is truly film free; these channels are usually of a very high sheet resistance and are therefore usually of negligible consequence. Under special circumstances as when subjected to ionizing environments, these channels may increase in electron concentration and become quite conductive. In this case, the opening in the silicon dioxide could be wholly inadequate to prevent degradation or failure of the device.

In FIG. 6, the exposed silicon is shown after being selectively diffused with P impurity to form a low resistivity P region 13. The P impurity source for this diffusion was provided by a layer of borosilicate glass 14 which was formed on the wafer in an impurity predeposition step prior to the diffusion. The diffused P region 13 extends back under the silicon dioxide so that the termination 15 of the NP junction so formed is moved back under the silicon dioxide and glass. The junction is now protected by the passivating film so that it has the low leakage associated with planar passivated devices and in addition the channel cannot extend into the more heavily doped P type diffused region 13 as the concentration of the induced negative charges is not as great as the concentration of available holes due to the increased concentration of P impurity. This P region will be subsequently referred to as the anti-channel region. For electrical connection a metal contact to the diffused zener diode region 8 is provided by etching a region (FIG. 6A) of silicon dioxide away without uncovering the PN junction and then metallizing the bare silicon. A metallized contact (52) is also made to the bottom of the die during the metallizing of the diffused region 8.

Figure 6A:
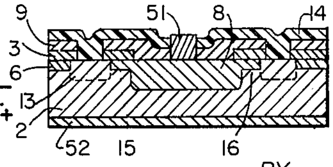
FIG. 6A is a cross section similar to FIG. 6, and showing the condition of the die after contacts have been applied to it.

An NP junction thus formed will have a high breakdown voltage if the diffused low resistivity P anti-channel region 13 is located away from the diffused N region. Although the resistivity of this P type anti-channel region may be very low, the small remaining part 16 of the induced channel (FIG. 6) lying between the diffused N region 8 and the anti-channel region 13 has the characteristics of high resistivity N type material so that if this remnant of the induced region is not too small a sufficiently wide depletion region will expand into it to satisfy the high breakdown voltage condition there. Thus a high breakdown voltage characteristic of the junction is attained by constructing the device so that all low resistivity material of either P or N conductivity type proximate to the junction has an adequately thick high resistivity region of the other conductivity type opposite it. FIG. 6A is a cross sectional view of the zener diode after metal contacts 51 and 52 have been applied respectively to N region 8 and to P region 2.

Figure 7:
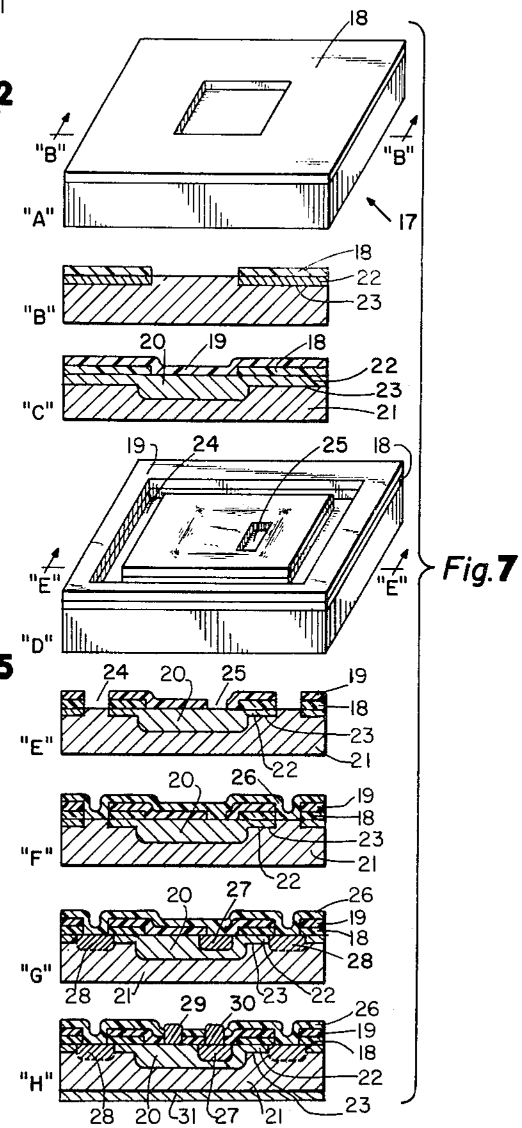
FIG. 7 shows the steps in the preparation of a non-channeling passivated transistor.

Planar passivated PNP transistors having a high collector-to-base breakdown voltage may be prepared in much the same manner as the previously described high voltage planar passivated diode. Suitable steps for fabricating such a device are illustrated in FIG. 7, and the steps are identified as steps A through H. A semiconductor element 17 consisting of pi silicon partially covered with thermally grown silicon dioxide 18 is selectively diffused with N impurity from a layer of predeposited phosphosilicate glass 19 to form an N region 20 and establish a collector-base junction. The N diffused region 20 is the base region of the device, and the pi region 21 just outside of this region is the transistor collector. The induced N region 22 is represented schematically as lying between the dashed line 23 and the silicon dioxide 18. After the N diffusion the previously diffused regions remain covered with phosphosilicate glass 19. Phosphosilicate glass is such that it may be used as a diffusion mask against boron impurity in the same manner as the silicon dioxide was used in masking against phosphorus.

Portions of layers 18 and 19 are etched away so that two regions of silicon 24 and 25 are exposed as shown at step E of FIG. 7. The semiconductor element is diffused with P impurity from a predeposited film of borosilicate glass 26 to form the emitter region 27 and the anti-channel region 28 of P diffused material is made at the same time with the same exposure to P impurity. Following this, regions of glass are removed to expose silicon at the base region 20 and the emitter region 27 of the transistor. The base and emitter may then be metallized to provide contacts 29 and 30, so that electrical connections may subsequently be made to the contacts. A collector contact 31 may be metallized on the other side of the die.

Figure 8:
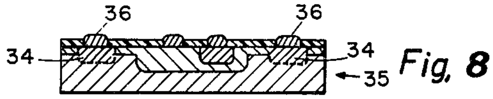
FIG. 8 shows a passivated transistor in which the anti-channel region has been metallized for use as a collector contact.

In FIG. 8 it is shown how the anti-channel region 34 may also serve as a collector connection for a transistor 35. A metal film 36 is evaporated and/or alloyed to the anti-channel region and electrical connection may be made to this film. Since the anti-channel region is heavily doped and runs completely about the edge of the base, it makes an excellent collector contact region. Alloying a doping metal alone or post-alloy-diffusion of impurity from a metal are alternative ways of forming an anti-channel region that could be used for a collector contact, if desired.

Figure 9:
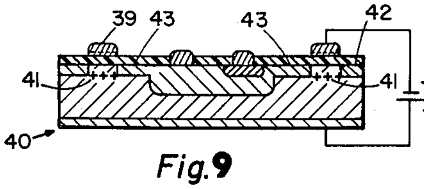
FIG. 9 shows a passivated transistor in which the anti-channel region is induced by the application of a biasing voltage to a metallized region on the surface of the passivating film.

FIG. 9 shows how an anti-channel region may be formed by induction. If a film of metal 39 is attached to the passivating oxide of the PNP transistor 40 and is negatively charged, a net positive charge 41 is caused to form in the region of the oxide-silicon interface 42. The excess of holes which now exists interrupts the N type channel 43. As is obvious, the general method is also suited for use with NPN transistors, diodes and other devices.

The P diffusion to form the anti-channel P region in planar passivated devices is noncritical, having just the requirements that the resistivity of the diffused P region be less than of the order of one ohm-centimeter near the surface and that the P impurity be of a suitable type that may be selectively diffused such as boron. A typical silicon dioxide or glass thickness for masking during diffusion of the P region on the NP diode described is one micron. The glass film thickness for the transistor is governed by the requirements of the length of time and the temperature for forming the emitter junction by diffusion but 4000–5000 angstrom units is suitable for most planar device diffusions.

Silicon dioxide is thermally grown by exposing silicon at a temperature in the order of 1100° C. to water vapor. The water vapor is customarily brought into contact with silicon by bubbling oxygen or hydrogen gas through water to saturate it and then flowing the gas-water vapor over the silicon. Alternatively, water is vaporized by boiling and the steam is allowed to flow over the hot silicon. The silicon is usually heated and oxidized in a furnace of the combustion tube type. The formation of impurity bearing glasses is discussed later in diffusion processing.

The invention as described thus far has been somewhat specific in its application, since it is largely concerned with the solution of problems peculiar to NP and PN planar passivated junctions. However, a more fundamental use of the techniques described (as applied to integrated circuits, for example) would be in forming anti-channel regions to prevent accidental interconnection or coupling between electronic components fabricated on the same substrate and so that induced channel regions of various shapes may be formed and/or isolated and it is intended that the scope of the invention include these uses. For example, in the NP junction case for silicon, a channel of a given size and shape may be formed by oxidizing pi silicon to form silicon dioxide having a resulting underlying N type induced channel, and selectively etching the silicon dioxide away so that the desired shape of silicon dioxide and channel is left and then diffusing the P type anti-channel region into the silicon not covered by the silicon dioxide.

The induction of channels in planar and other devices when passivating and similar films of highly resistive inorganic material are formed on pi silicon has been largely independent of the device or its design. Leakage currents and other degrading effects due to undesired or "accidental" channels are especially troublesome in devices which are dependent for their operation on majority carrier flow through one or more functional channels and these devices; e.g., field effect transistors, current limiters, and similar devices, and the anti-channel region is very effective in eliminating this difficulty. As previously discussed, channels which form at the surfaces of bare semiconductor material may, under special conditions, seriously alter the operating character of a device and these channels are also readily interrupted by an anti-channel region. It is intended that the scope of the invention also include the interruption of such channels, in order to improve devices other than planar transistors and diodes, by selectively diffusing or otherwise introducing the proper impurity into semiconductor material in order to lower the resistivity below the level at which such channels may exist or are detrimental and in selected regions at the surface of the semiconductor material.

General fabrication techniques for planar passivated devices are known in the art. Examples of these techniques as applied to a PNP transistor are as follows.

Well-known photolithographic techniques are very useful in removing selected regions of silicon dioxide and impurity bearing glasses. A photosensitive resist that is not attacked by hydrofluoric acid is applied in liquid form to the silicon in a uniform coating and allowed to dry. A pattern consisting of transparent and opaque areas, the opaque areas corresponding in shape to the regions that are to be removed, is placed against the surface of the resist covered silicon and then this system is exposed to ultraviolet light. The resist is developed and the areas of the resist that were shaded from the light by the opaque areas of the pattern are washed away uncovering the underlying silicon dioxide or glass film. The silicon is then placed in hydrofluoric acid and the unprotected areas of this film are etched away. After cleaning and removal of the remaining photo-resist, the silicon may be diffused.

Although the diffusion used to form the anti-channeling region is a diffusion using a P impurity such as boron from a borosilicate glass impurity source, to be described later, the preparation and use of the calcium phosphosilicate glass or another functionally equivalent phosphosilicate glass as an N impurity (phosphorus) source is directly important to this process. Calcium phosphosilicate glass may be used in the preparation of N regions of silicon and then, since it also has an effective masking action against the diffusion of boron, it may be used at the same time, and where conditions warrant, both as a phosphorus source and as a masking material for selectively diffusing boron into silicon.

The calcium phosphosilicate glass is formed on the surface of the silicon in a prediffusion operation by heating it in a closed system in the presence of a source glass previously prepared by heating calcium oxide and phosphorus pentoxide together. After a suitable thickness of calcium phosphosilicate glass has been formed on the silicon, the silicon is transferred to a diffusion furnace where the silicon is preheated to diffuse the phosphorus from the glass into the silicon. The prediffusion of the silicon using a source glass consisting of fifteen parts by weight of phosphorus pentoxide to one part of calcium oxide may be performed by heating the glass and the silicon in a closed platinum box within a furnace at a temperature of 800° C. for a period of time of about ten minutes in a nitrogen atmosphere. Silicon and silicon dioxide react with the phosphorus pentoxide and calcium oxide vapors and a film of calcium phosphosilicate glass forms on the silicon. After prediffusion, the silicon wafers are transferred to another furnace of the combustion type where they are heated at a temperature of 1100° C. for one hour in water vapor and then are heated for two and one-half hours longer in the same furnace in an atmosphere of flowing dry oxygen. Water vapor for the furnace is supplied by vaporizing water by boiling and forcing the steam to flow through the diffusion furnace while vaporizing at a rate of approximately one-half pint of water for each four square inches of furnace tube cross section. After the one hour of water vapor exposure, dry oxygen is started through the furnace at about 1000 cubic centimeters per minute for the remainder o fthe diffusion period. The use of water vapor followed by oxygen causes the formation of the thick and dense glass required for masking against a subsequent P diffusion of boron from a film of borosilicate glass. This treatment for pi silicon of 3 ohm-centimeter resistivity will produce an NP junction about 3 microns deep and will form a layer of glass about 5000 angstrom units thick.

After the silicon at the intended emitter and anti-channel regions has been selectively etched free of calcium phosphosilicate glass and silicon dioxide, a film of borosilicate glass is formed on the silicon wafer largely using well-known techniques. The regions of the silicon that were stripped of glass are given a light coat of silicon dioxide by heating in water vapor at 900° C. for thirty minutes. A combusion tube furnace is used and water is vaporized at a rate of about one-half pint per hour for a four square inch furnace tube cross section. After the silicon dioxide is formed, the wafers are heated and exposed to boron trioxide vapor in a closed system. Boron trioxide and the silicon wafers are separated in a small closed quartz or molybdenum box which is then heated to 950° C. in hydrogen for about one hour to form the borosilicate glass. The box, which is not completely gas tight, is heated in a combustion tube furnace in an atmosphere of hydrogen. The hydrogen flow through the combustion tube is about 1000 cubic centimeters per minute for a tube of about four square inches in cross section.

After these prediffusion operations, the silicon wafers are removed from the box and transferred to a combustion tube type diffusion furnace where boron impurity from the borosilicate glass film is diffused into the silicon. The silicon, typically, is diffused at a temperature of 1100° C. for thirty minutes in dry hydrogen. The hydrogen flow is typically 400 cubic centimeters per minute through a four square inch cross section tube. The conditions given this P type prediffusion and diffusion are requirments for a transistor based on the formation of an emitter junction at the same time as the anti-channel region is formed. In the case where the less critical anti-channel region is diffused alone, a lighter or heavier diffusion is acceptable. For the two diffusions previously described, a PN emitter-to-base junction will be formed at a depth of about 2 microns.

In the case where the anti-channel region is diffused alone, it is necessary that its resistivity be low enough so that depletion region formation is essentially into the adjacent channel and not to any appreciable extent into the anti-channel region itself unless oxide or other films covering the region are thick enough and of a type to passivate it. If the resistivity is high enough the bias voltage is able to move the depletion region well into the anti-channel region (a region of high carrier recombination) from beneath a passivating film, then the electrical or effective boundary of the channel—anti-channel PN junction terminates there and one condition for optimization of the device, i.e., termination of the channel beneath a passivating film, is no longer satisfied. For minimum leakage currents, the anti-channel region must have a covering passivating film and/or be of a suitably low resistivity as to preclude a wide depletion region spreading into it.

Using the previously described materials and processing and maintaining a separation between the diffused base region and the diffused anti-channel region of about .001 inch, planar passivated PNP transistors having a breakdown voltage characteristic (measured with the collector-to-base junction reverse biased, the emitter open circuited, and with a collector current of 10 microamperes) of over 100 volts are routinely fabricated. Before this invention, a breakdown voltage of 20 volts was considered fairly high for this general type of transistor.

The invention as applied to PN diodes is the same as in the case of NP diodes if everywhere P type semiconductor material and impurity are substituted for N type and vice versa. In FIGS. 1–6 it is assumed that a P type channel 6 or its equivalent forms beneath the silicon dioxide 3 on the N type silicon 2. Diffusion through the hole 5 uses a glass 9 such as borosilicate glass as an impurity source for preparing the P region 8. As in the case of the NP diode, a ring 11 of silicon dioxide and glass is etched away to expose the silicon and N impurity is diffused in to form the anti-channel region 13. The glass 14 is phosphosilicate glass and is the source of N impurity during the diffusion step in which the anti-channel region 13 was formed.

As in the cases of the NP and PN categories of diodes, except for the conductivity types of the materials, improved NPN planar transistors according to this invention are vary similar to the previously discussed PNP transistors. Considering FIG. 7 again but for the NPN case, selective diffusion through an opening in a silicon dioxide film 18 is used to establish a P region 20 which will be the base region of the transistor. The source of P impurity is a predeposited film of borosilicate glass 19. A P type channel 22 could provide a leakage path for hole flow to regions of high hole-electron recombination. Selective diffusion of N type impurity through the etched region 24 forms the anti-channel region 28 as a part of the diffusion step used to form the emitter region 27 through its opening 25. The source of N impurity for the emitter and anti-channeling region is the phosphosilicate glass film. The PN junction formed by the channel and the N type anti-channel region is protected by the passivating film thereby preventing device degradation as in the PNP transistor.

High breakdown voltage planar passivated devices generally may be expected to have greater intrinsic and commercial value than the lower breakdown voltage devices. This invention makes it possible, with little added expense, to manufacture planar passivated NP, PN, PNP, NPN and other junction devices having high breakdown voltage characteristics. For each device, this is accomplished by the simple and direct means of selectively diffusing impurity into the silicon (or other semiconductor material) in a region peripheral to the surface portion of the junction so that an induced channel cannot exist in the region, thereby isolating, limiting the size, and minimizing the effect of that part of the induced channel adjacent the junction region. Also of major importance is the fact that when a device junction is equipped with the anti-channel region then that junction is well determined and will tend to remain so during exposure to channel-causing environments, e.g., radioactive environments, which would ordinarily alter its area and nature to a significant degree.

More fundamentally, this invention also provides a means of forming and isolating variously shaped channels on silican and other semiconductor material.

I claim:

1. In a semiconductor device which has desired reverse current and breakdown voltage characteristics and is one of the type of a group which includes NP, PN, PNP, and NPN devices, said semiconductor device including a semiconductor element having therein a first region and a second region which are adjacent one another and are of opposite conductivity type, a junction at the interface of said two regions, and a grown passivating coating on the top surface of the semiconductor element under which a channel can form within said element immediately at said top surface and which would extend laterally out of said second region into said first region and would be of opposite conductivity type to said first region, with said junction upon formation of such a channel likewise extending outwardly from said second region along the interface of such a channel and the first region, the improvement comprising a channel-interrupting region formed in said first region which provides the desired reverse current characteristic and maintains the desired breakdown voltage characteristic for the semiconductor device by interrupting and terminating any such a channel at a place spaced laterally away and separated from said second region and completely surrounding said second region, said channel-interrupting region being of the same conductivity type as said first region, of lower resistivity than the same, and extending downwardly from said top surface through such a channel and into said first region to a total depth greater than the depth from said top surface of any such a channel so as to structurally block such a channel and turn said junction upwardly toward and to said top surface underneath said passivating coating, with said spacing and separation of said channel-interrupting region from said second region being an amount sufficient to accommodate the entire depletion region in the semiconductor element to maintain said desired breakdown voltage during the operation of said semiconductor device.

2. In a semiconductor device as defined in claim 1 from the group including only the NP and PNP conductivity types having a silicon element therein with the second region of said element being of N conductivity type, with the channel-interrupting region being of P conductivity type, with said passivating coating thereof being a grown silicon dioxide layer on the top surface of said silicon element, and with any such channel formed in said silicon element being of N conductivity type and extending into said first region for the entire dimension between said N conductivity type second region and said P conductivity type channel-interrupting region.

3. In a semiconductor device as defined in claim 1 from the group including only the PN and NPN conductivity types having a silicon element therein with the second region of said element being of P conductivity type, with the channel-interrupting region being of N conductivity type, with said passivating coating thereof being a grown silicon dioxide layer on the top surface of said silicon element, and with any such channel formed in said silicon element being of P conductivity type and extending into said first region for the entire dimension between said P conductivity type second region and said N conductivity type channel-interrupting region.

4. In a semiconductor device as defined in claim 1 comprising a diode wherein the grown passivating coating is silicon dioxide and said element is silicon, a metal contact secured to said second region of the semiconductor element and extending through said silicon dioxide coating for connecting said second region into a circuit, and a metallized contact on the bottom of the semiconductor element secured to said first region for connecting said first region into a circuit.

5. In a semiconductor device as defined in claim 1 comprising a transistor wherein the gown passivating coating is silicon dioxide and said element is silicon, said first region comprises the collector region, and said second region comprises the base region, an emitter wholly within said base region, metal contact means secured to said base region and to said emitter region respectively, and metal contact means secured to said collector region at the bottom surface of said silicon element.

6. In a semiconductor device the combination including a silicon semiconductor element having a body portion and having in said body portion a region of a predetermined conductivity type, a grown passivating coating of silicon dioxide on the top surface of the semiconductor element under which a channel can form within said element immediately at said top surface and which would extend laterally out of said region of said predetermined conductivity type into said body portion, which said body portion being of the opposite conductivity type to that of said region, and with a junction at the interface of any such a channel and said body portion and likewise extending outwardly from said region into said body portion, and means for isolating said region within said body portion and providing a desired reverse current characteristic and maintaining a desired breakdown voltage characteristic for the semiconductor element, said means including a channel-interrupting region which interrupts and terminates any such channel at a place spaced laterally away and separated from said region and which completely surrounds said region in said body portion, said channel-interrupting region being of the same conductivity type as said body portion, of lower resistivity than the same, and extending downwardly from said top surface through any such a channel and into the body portion a total depth greater than the depth from said top surface of any such a channel so as to structurally block any such a channel and turn said junction upwardly toward and to said top surface underneath said grown passivating coating, with said spacing and separation of said channel-interrupting region from said region being an amount sufficient to accommodate the entire depletion region in the semiconductor element to maintain said desired breakdown voltage during the operation of said semiconductor device.

7. In a semiconductor device which has desired reverse current and breakdown voltage characteristics and includes a semiconductor element having therein a body portion and having in said body portion a region of a predetermined conductivity type, the combination including a grown passivating oxide coating on the top surface of said semiconductor element under which a channel can form within said element immediately at said top surface and which channel would extend laterally out of said region of a predetermined conductivity type into said body portion, with said body portion being of the opposite conductivity type to that of said region and any such a channel being of the same conductivity as said region, a metal contact ohmically connected to said semiconductor element at said region and extending through said grown passivating oxide coating, a metal contact ohmically connected to said body portion on the bottom surface of said semiconductor element opposite to said top surface thereof, and means for inducing a channel-interrupting region in said semiconductor element including a metal film secured to said grown passivating oxide coating on the outside thereof in a position thereon which is spaced laterally outwardly relative to the position of said region in said semiconductor element and is above said body portion and surrounds the position of said region in said element, said inducing means also including electrical means connected between said metal contact on the bottom surface of said semiconductor element and said metal film to charge the latter and cause a charge opposite in polarity to the charge on said metal film to form in said semiconductor element below said metal film and substantially coextensive therewith in a position surrounding said region and spaced laterally away therefrom, said charge in said semiconductor element occupying a space in said body portion and providing an induced channel-interrupting region which extends downwardly from said top surface through any such a channel in said body portion to interrupt such a channel, with said channel-interrupting region being of the same conductivity type as said body portion and opposite to the conductivity type of any such a channel and providing the desired reverse current characteristic for the semiconductor device, with said lateral spacing for said channel-interrupting region away from said region being an amount such as to accommodate the entire depletion region in the semiconductor element and maintain said desired breakdown voltage.

8. The semiconductor device as defined in claim 7 wherein the region of the semiconductor element comprises a diode region of one conductivity type having a channel of the same conductivity type extending out of said diode region into said body portion, a junction at the interface of said channel and said body portion, and with said induced channel-interrupting region extending through said channel and turning said junction upwardly toward and to the top surface of said semiconductor element.

9. In a semiconductor device as defined in claim 7 of the transistor type wherein said region of the semiconductor element is the base region of the transistor, an emitter region in said base region, and with said body portion comprising the collector region, a junction at the interface of said channel and said collector region, and with said induced channel-interrupting region extending through said channel and turning said junction upwardly toward and to the top surface of said semi-conductor element.

References Cited by the Examiner

UNITED STATES PATENTS

| | | | |
|---|---|---|---|
| 2,748,325 | 5/1956 | Jenny | 317—234 |
| 2,791,760 | 5/1957 | Ross | 317—235 X |
| 2,816,850 | 12/1957 | Haring | 148—33 |
| 2,899,344 | 8/1959 | Atalla et al. | 317—235 X |
| 2,936,410 | 5/1960 | Emeis et al. | 317—235 |
| 2,997,604 | 8/1961 | Shockley | 307—88.5 |
| 3,007,090 | 10/1961 | Rutz | 317—235 |
| 3,025,589 | 3/1962 | Hoerni | 317—235 X |
| 3,056,888 | 10/1962 | Atalla | 307—88.5 |
| 3,074,826 | 1/1963 | Tummers | 317—235 X |
| 3,091,701 | 5/1963 | Statz | 317—235 X |
| 3,097,308 | 7/1963 | Wallmark | 317—234 X |
| 3,099,591 | 7/1963 | Shockley | 148—33 |
| 3,117,229 | 1/1964 | Friedland | 317—234 X |
| 3,140,438 | 7/1964 | Shockley et al. | 307—88.5 X |
| 3,197,681 | 7/1965 | Broussard | 317—235 |
| 3,024,160 | 8/1965 | Sah | 317—234 |
| 3,206,670 | 9/1965 | Atalla | 317—235 X |

FOREIGN PATENTS

| | | |
|---|---|---|
| 924,121 | 4/1963 | Great Britain. |
| 1,279,484 | 11/1961 | France. |

OTHER REFERENCES

"Some Effects Of Semiconductor Surfaces On Device Operation," by George De Mars, Semiconductor Products, April 1959.

Article by O. Janisch: Solid-State Electronics of July-August, 1962; pages 249–259. Published by Pergamon Press, Oxford, England.

JAMES D. KALLAM, *Acting Primary Examiner.*

A. M. LESNIAK, *Assistant Examiner.*